| United States Patent [19] | [11] Patent Number: 4,906,404 |
| --- | --- |
| Suehiro et al. | [45] Date of Patent: Mar. 6, 1990 |

[54] COPPER CONDUCTOR COMPOSITION

[75] Inventors: Masatoshi Suehiro; Masashi Echigo, both of Kyoto; Masami Sakuraba, Nagaokakyo; Yutaka Mitsune, Daito; Seiichi Nakatani, Hirakata; Tsutomu Nishimura, Uji, all of Japan

[73] Assignees: Dai-Ichi Kogyo Seiyaku Co., Ltd., Kyoto; Dowa Mining Co., Ltd., Tokyo; Matsushita Electric Industrial Co., Kadoma, all of Japan

[21] Appl. No.: 267,592

[22] Filed: Nov. 7, 1988

[51] Int. Cl.$^4$ ............................................... H01B 1/06
[52] U.S. Cl. ............................... 252/512; 252/518; 252/520; 106/1.13; 106/1.22; 106/1.23
[58] Field of Search ...................... 252/512, 518, 520; 106/1.13, 1.18, 1.22, 1.23, 1.26

[56] References Cited

U.S. PATENT DOCUMENTS

| | | | |
| --- | --- | --- | --- |
| 2,993,815 | 7/1961 | Treptow | 252/512 |
| 3,341,363 | 9/1967 | Owen | 427/96 |
| 3,647,532 | 3/1972 | Friedman et al. | 117/212 |
| 3,988,647 | 10/1976 | Bolon et al. | 317/101 |
| 4,070,518 | 1/1978 | Hoffman | 428/209 |
| 4,072,771 | 2/1978 | Grier, Sr. | 427/96 |
| 4,172,919 | 10/1979 | Mitchell | 428/209 |
| 4,225,468 | 9/1980 | Donohue et al. | 252/509 |
| 4,322,316 | 3/1982 | Provance et al. | 252/512 |
| 4,323,483 | 4/1982 | Rellick | 252/512 |
| 4,514,321 | 4/1985 | Siuta | 252/512 |
| 4,521,329 | 6/1985 | Siuta et al. | 252/512 |
| 4,540,604 | 9/1985 | Siuta | 427/96 |

FOREIGN PATENT DOCUMENTS 781400 5/1935 France .
1559523 1/1980 United Kingdom .

*Primary Examiner*—Josephine Barr
*Attorney, Agent, or Firm*—Armstrong, Nikaido, Marmelstein, Kubovcik & Murray

[57] ABSTRACT

A copper conductor composition having an improved solderability as well as a good adhesion, which comprises a copper powder, an inorganic binder and a boride or silicide of a metal such as W, Mo, Ti, Ta, Nb or Cr. The solderability is kept on a good level even if the composition is subjected to a firing operation repeatedly.

1 Claim, No Drawings

COPPER CONDUCTOR COMPOSITION

BACKGROUND OF THE INVENTION

The present invention relates to a copper-containing conductor composition, and more particularly to a composition for providing a thick film copper conductor having an improved solderability (wettability by solder), and a conductor element including a patterned conductor layer prepared from the composition.

Thick film conductors are widely used as a means for interconnecting components or parts in various electronic devices, including hybrid microcircuits. In general, conductors are required to have properties such as electric conductivity, solderability, solder leach resistance and adhesion to substrates or base materials. Thick film conductor compositions are composed of a conductive metal and an inorganic binder, which are in finely divided form and are dispersed in an organic medium, and optionally other additives. These ingredients are selected according to performance characteristics which are sought.

Thick film conductors using copper as conductive metal have been introduced at first from the viewpoint of cost reduction for thick film conductors containing as conductive metal an expensive noble metal such as gold, silver, platinum or palladium. Recently, attention is paid to characteristics that copper itself has, particularly to high frequency characteristics, thus various thick film copper conductor compositions have been proposed and applied to various fields. For instance, U.S. Pat. No. 2,993,815 to Treptow discloses a conductor composition for printed circuits containing 5 to 50% by weight of copper or copper oxide and 1% by weight of reduction-resistant glass frit, from which a copper conductive layer is formed by firing in two stages at a temperature of 500 to 1050° C. U.S. Pat. No. 3,647,532 to Friedman discloses a composition containing copper, a glass frit and a lead borosilicate glass binder containing cadmium oxide. U.S. Pat. No. 3,988,647 to Bolon et al discloses a conductor composition containing copper particles, which have been treated to remove oxide from the surface, dispersed in a solventless polymeric binder. U.S. Pat. No. 4,070,518 to Hoffman discloses a conductor composition containing 85 to 97% by weight of copper powder and 3 to 15% by weight of a Cd- and Bi-free lead aluminoborate glass frit. U.S. Pat. No. 4,072,771 to Grier discloses a conductor composition containing Cu particles which have been preoxidized to form a CuO surface layer, the amount of CuO being 1 to 5% by weight of the total solids, and 1 to 10% by weight of, based on the total solids, a lead aluminoborate glass frit.

Also, U.S. Pat. No. 4,172,919 to Mitchell discloses a conductor composition containing 86 to 97% by weight of copper, 1 to 7% by weight of CuO, and 1 to 7% by weight of a glass frit containing at least 75% by weight of $Bi_2O_3$. U.S. Pat. No. 4,322,316 to Provance discloses a conductor composition containing 7 to 27% by Weight of boron, 0 to 35% by weight of a glass frit and a residual amount of CuO. U.S. Pat. No. 4,323,483 to Rellick discloses a conductor composition comprising copper, copper oxide, lead oxide and bismuth oxide, which does not require the use of a glass frit. U.S. Pat. No. 4,521,329 to Siuta it al discloses a conductor composition containing a copper powder having an oxide coating, copper oxide and an inorganic binder having softening point of 300° to 700° C. Further, in published European Patent Application No. 0068167, McCormick et al disclose a conductor composition containing 65 to 80% by weight of Cu, 0 to 6% by weight of CuO and 3 to 8% by weight of Bi-free low softening glass.

Upon formation of copper conductors, the conductor compositions as mentioned above are applied to suitable substrates, and the applied compositions are fired. The firing is conducted in a nonoxidizing atmosphere, usually in a nitrogen atmosphere the oxygen content of which is from 1 to 10 p.p.m., for preventing oxidation of copper. However, it is known that the surface of copper conductor is gradually oxidized by a trace amount of oxygen remaining in the nitrogen atmosphere, thus resulting in deterioration of solderability. The deterioration in solderability is marked particularly when the firing is repeated. Therefore, for avoiding such problem it is necessary to shorten the firing time, or to conduct the firing in a very pure nitrogen atmosphere, or to decrease the number of firing operations, thus applications of conventional conductor compositions as mentioned above have been restricted.

In order to secure a good solderability even after firing repeated plural times, Siuta et al propose conductor compositions containing 0.2 to 5% by weight of metallic W, Mo, Re, alloys or mixtures thereof in U.S. Pat. Nos. 4,514,321 and 4,540,604. W, Mo and Re are used for the purpose of providing copper having a substantially oxide free surface by a reaction of W, Mo or Re with the oxide in the copper surface and oxygen present in a trace amount in the firing atmosphere. on the other hand, the copper particles used have a copper oxide coating. Since the copper oxide coating would deteriorate the solderability, copper oxide must be reduced by the above metals such as W during the firing. Therefore, when the portion of these metals which are consumed to reduce copper oxide increases, in other words, when these metals are mostly consumed for reduction of copper oxide, the action of these metals to catch oxygen present in the firing atmosphere, which is another effect of these metals, decreases, thus a satisfactory improvement in solderability is hard to be obtained.

There are known some proposals of utilization of borides in the electric and electronic fields.

For instance, U.S. Pat. No. 4,225,468 to Donohue discloses a resistor composition containing $LaB_6$ and glass, which is fired in a nonoxidizing atmosphere. Also, French Patent No. 781400 discloses a resistor composition comprising a mixture of an alkaline earth metal aluminoborate glass frit and a metal hexaboride. These known compositions are for providing a resistor, and the patents do not disclose the improvement in solderability of thick film conductors by using copper with metal borides.

Metal silicides have heat resistance and oxidation resistance. They have also a higher conductivity than oxides and are usable as materials having a conductivity. Accordingly, silicides attract attention as a target in respect of semiconductors. However, in conventional copper conductor compositions, there is no proposal about the use of metal silicides.

It is proposed to use metal silicides in resistor compositions. For instance, U.S. Pat. No. 3,341,363 to Owen discloses a thick film resistor composition containing Si, $WO_3$, $MoSi_2$, Co, W, Mg and an inorganic powder binder consisting of kaolin and a glaze material. British Patent No. 1,559,523 discloses a resistor composition containing a borosilicate glass frit and a metal silicide. In electronic circuits, the metal silicides used in these resistor compositions function as a resistor rather than as a conductor. It is not taught at all to improve the solderability of thick film conductors by using copper with metal silicides.

It is an object of the present invention to improve the solderability of conventional copper conductor compositions.

A further object of the present invention is to provide a conductor composition capable of giving a thick film copper conductor having an improved solderability as well as other good properties such as adhesion to ceramic substrate and other substrates.

Another object of the present invention is to provide a conductor element comprising a ceramic substrate having a patterned copper conductor having an improved solderability as well as other good properties such as adhesion to the substrate.

These and other objects of the present invention will become apparent from the description hereinafter.

SUMMARY OF THE INVENTION

It is known, as mentioned above, that the deterioration in solderability of copper conductor films would result from oxidation of the surface of copper. It is also recognized that the deterioration in solderability would result from coarsening of crystal grains of copper caused by firing, namely difference in surface condition of the copper conductor film.

Even if only a copper powder into which no inorganic binder is incorporated in disregard of properties other than solderability, particularly in disregard of adhesion strength, is repeatedly fired in a nitrogen atmosphere used generally, deterioration in solderability which would raise a problem in practical use is not observed despite that the surface of copper conductor would be oxidized to some extent because no special treatment for preventing the oxidation is conducted, and despite that coarsening of crystal grains occurs. From such a result, it is considered that the solderability greatly depends on the sintered state of a copper powder and an inorganic binder.

It is essential for obtaining conductor films having good characteristics that the inorganic binder, the typical example of which is glass, is softened and wets a copper powder at a suitable temperature region and moreover the sintering proceeds. Since the metal and the oxide are not dissolved in each other, the molten inorganic binder is present in the space between the copper particles and in the grain boundary. According to the inventor's investigation, it is observed that in case of usual inorganic binders, it is difficult to prevent coarsening of grains when the firing is repeated. It is considered that such a grain growth means decrease of the space in the sintered product, and accordingly an amount of the inorganic binder which cannot be retained in the conductor is squeezed to the surface of the conductor, thus resulting in deterioration of solderability.

For obtaining performance characteristics required for thick film conductors, it is important to make the sintered film dense. In a composite system of a metal and an inorganic binder like a thick film conductor composition, the inorganic binder firstly shows a liquid flow behavior and flows into the space between the solid particles. Simultaneously the metal particles move to be re-oriented, thus the density of the sintered film rises. Therefore, if the amount of the inorganic binder is small, the sintering which is achieved through the liquid phase does not proceed sufficiently and, therefore, the space is not completely filled by one firing operation and a satisfactory dense sintered film is not obtained. In case of the film structure of the thus obtained product, the adhesion strength and solder leach resistance are poor. For such a reason, in conventional conductor compositions, usually a proper metal/inorganic binder ratio is selected so that a dense film structure is formed by one firing operation. When the so formulated conductor compositions are repeatedly fired, the sintering proceeds in excess, thus resulting in coarsening of crystal grains, namely decrease of grain boundary density, and consequently the solderability is deteriorated as stated above. Accordingly, it is important for obtaining a dense sintered film to cause the sintering to proceed sufficiently, but it is also necessary to control the sintering of metals so as to control the grain growth.

The present inventors made a study from such a point of view and have now found that metal borides and metal silicides have an effect on controlling the crystal grain growth and the solderability can be remarkably improved by incorporating them in conductor compositions containing a copper powder and an inorganic binder which are dispersed in an organic medium.

The copper conductor composition of the present invention containing a boride and/or a silicide provides a conductor having an excellent solderability as well as other properties required as conductor such as adhesion to substrates.

DETAILED DESCRIPTION

The reason why the solderability is improved by the addition of a boride or a silicide is considered as follows: Since the grain boundary possesses various lattice defects, it is in the state of high energy level. Therefore, if the energy of the whole grain boundary decreases, in other words, if the grain boundary decreases, the grain boundary is present stable, but the decrease of grain boundary leads to the coarsening of crystal grains. On the other hand, in the case that a boride or a silicide is added according to the present invention, it is considered that an impurity element is present in the grain boundary and the grain boundary energy per unit area is decreased, whereby the coarsening of crystal grains is prevented to improve the solderability.

As another means for making the crystal grains in the sintered body fine, it is considered to add an oxide stable at high temperatures to conductor compositions. However, an oxide is used as the inorganic binder in usual conductor compositions and, therefore, even if an oxide having a high melting point is added for the purpose of preventing the coarsening, it may react with the inorganic binder or may be dissolved therein. For such reasons, it is expected that the addition of a small amount of the oxide has no effect on the prevention of coarsening. On the other hand, if the oxide is used in a large amount, since it raises the softening point or melting point of the inorganic binder, a dense sintered film is hard to be formed, thus the conductivity and adhesion are lowered.

From the viewpoint of preventing the sintering from proceeding in excess, it is also considered to add a metal having a higher melting point than copper to conductor compositions in order to improve the solderability. However, this means is also unsuccessful. In case of a metal such as Ti, Zr or Si, the addition thereof reversely affects because they form an alloy with copper to lower the melting point. Vanadium acts to raise the melting point, but a large quantity is required for this purpose. Since high melting metals are poor in solderability, the use of a large quantity of vanadium rather lowers the solderability of copper conductors. Further, in case of metals inactive with copper, such as W or Mo, they have no effect, as mentioned before, because they react with oxygen to change to volatile oxides.

As stated above, even if the oxide or the metal is added, these additives cannot be stably present in a system containing copper and an inorganic binder and are not useful for prevention of the coarsening of crystal grains.

The composition of the present invention is a copper conductor composition to be fired in a nonoxidizing atmosphere, and is characterized by containing a metal boride and/or a metal silicide.

Examples of the boride used in the present invention are tungsten boride, molybdenum boride, titanium boride, tantalum boride, niobium boride, chromium boride, solid solutions thereof, and mixtures thereof. These metal borides have similar appearance and properties to metals and show a high electric conductivity. Also, these metal borides have a high melting point and a low vapor pressure. It is possible to use them in a nonoxidizing atmosphere even at high temperatures over 2000° C.

Examples of the silicide used in the present invention are tungsten silicide, molybdenum silicide, titanium silicide, tantalum silicide, niobium silicide, chromium silicide, solid solutions thereof, and mixtures thereof.

The boride and silicide may be used alone or in admixture thereof.

The metal borides and silicides having various ratios of elements are known. For examples, in case of tungsten boride, $W_2B$, $WB$ and $W_2B_5$ are known. The borides and silicides with any compositions can be used in the present invention and produce good results. In case of the silicides, disilicide compounds which have the highest silicon content among the silicides are particularly preferable.

The borides are used in an amount of 0.01 to 1% by weight, preferably 0.05 to 0.5% by weight, based on the conductor composition. When the content of borides is more than 1% by weight, the interface between copper and inorganic binder becomes more stable rather than the Cu-Cu interface, thus resulting in deterioration of adhesion strength.

The amount of silicides is from 0.01 to 3% by weight, preferably 0.05 to 1% by weight, based on the conductor composition. When the content of silicides is more than 3% by weight, the adhesion strength is lowered for the same reason as above.

The metal borides can be present stably in conductors. The metal silicides have a high melting point and an oxidation resistance. The reason why the silicides have a high oxidation resistance is that in the case of silicides of Cr, Ti, Ta and Nb, a dense oxide layer is formed in the surface, and that in the case of silicides of W and Mo, the oxides of these metals have a very high vapor pressure and, therefore, the oxides sublime immediately after oxidation, but $SiO_2$ remains as a protective layer and prevents a further sublimation. Accordingly, the metal silicides can also be present stably in conductors.

In addition to possession of properties as metals, the wettability of borides or silicides with inorganic binders is superior to metals, thus it is considered that the borides or silicides play a role as a buffer for copper and inorganic binder. That is to say, it is considered that the borides or silicides which serve as a buffer are adsorbed in the interface between copper and inorganic binder to thereby decrease the energy of grain boundary between copper and inorganic binder.

Copper powders and inorganic binders which have been usually employed in the art can be employed in the present invention.

The content of copper powder in the conductor composition is usually from 70 to 90% by weight.

Representative examples of the inorganic binder are, for instance, inorganic metal oxides such as ZnO, CuO, $Cu_2O$, $Bi_2O_3$, $TiO_2$ and $Al_2O_3$, especially ZnO and $TiO_2$, and glass frits such as $PbO.B_2O_3$, $PbO.B_2O_3 SiO_2$ and $ZnO.B_2O_3.SiO_2$. The inorganic binder is usually used in an amount of 0.1 to 10% by weight based on the conductor composition.

An organic medium (vehicle) is incorporated in the conductor composition in order to import suitable consistency and rheology for printing or coating to the conductor composition. Conventionally used vehicles are applicable to the present invention, A 3 to 10% by weight solution of a polymer in an organic solvent is usually used as the vehicle. The vehicle is used in an amount of 8 to 20% by weight based on the conductor composition.

The composition of the present invention may contain other additives as occasion demands, for example, surface active agents and antioxidants.

Copper conductors are formed from the copper conductor composition of the present invention in a usual manner. That is to say, the composition is applied to a substrate such as ceramic substrate, usually by screen printing, and the printed pattern is then dried. The dried pattern is then fired in a nonoxidizing atmosphere such as nitrogen in order to effect volatilization of the organic medium and sintering of the finely divided copper particles and inorganic binder, usually at a peak temperature of 850° to 950° C. for 30 minutes to 1 hour.

The copper conductors prepared from the composition have excellent solderability, adhesion strength and other properties, and are applicable to various electric and electronic elements or devices. For instance, in fabrication of circuits, the conductor composition of the invention is applied to a substrate in a suitable pattern and is fired in a nonoxidizing atmosphere to form a conductor pattern. Then a resistor composition is applied in a suitable pattern and fired in a nonoxidizing atmosphere.

The present invention is more specifically described and explained by means of the following Examples, in which all % are by weight unless otherwise noted. It is to be understood that the present invention is not limited to the Examples.

In the following Examples, the solderability and adhesion were measured as follows:

Solderability

A sample applied with a flux ("XA-100" made by Tamura Kaken Kabushiki Kaisha) is dipped in a soldering bath (230°±5° C.) (solder: 60% Sn, 37% Pb) for 5 ±0.5 seconds for evaluation of solderability in respect of soldered area of 2 mm×2 mm conductor pads.

Adhesion

A sample applied with a flux is dipped in a soldering bath (230°±5° C.) for 5 ±0.5 seconds. A tinned annealed copper wire having a diameter of 0.65 mm is soldered onto a conductor pad (2 mm×2 mm) using a soldering iron. The copper wire is then pulled at a speed of 10 mm/minute in the perpendicular direction using a tensile tester for measurement of strength.

EXAMPLES 1 TO 6

A copper powder having an average particle size of 1.2 μm, a glass frit (PbO.B$_2$O$_3$ composite glass having a softening point of 390° C.), a boride and an organic binder (a 5% solution of 100 cps ethyl cellulose in terpineol) were admixed according to the formulation shown in Table 1, and the mixture was uniformly dispersed to form a paste by a three roll mill. The paste was applied to a 96% alumina substrate by means of screen printing. The printed paste was dried at 120° C. for 10 minutes, and fired at 900° C. for 10 minutes in a nitrogen atmosphere containing 5 p.p.m. of oxygen. The obtained conductor was tested with respect to solderability and adhesion.

The results are shown in Table 1.

The results are shown in Table 1.

EXAMPLES 10 TO 18

Copper conductors were prepared in the same manner as in Example 1 except that the silicides shown is Table 2 were used instead of the borides.

The results are shown in Table 2.

COMPARATIVE EXAMPLES 1 TO 11

Copper conductors were prepared in the same manner as in Example 1 from conductor compositions prepared according to the formulations shown in Table 3.

The composition of the Comparative Example 1 does not contain a glass as inorganic binder and the composition of Comparative Example 2 consists only of copper, glass, and the organic binder. In Comparative Examples 3 to 7, a metal is used alone. Also, in Comparative Examples 8 to 11, two kinds of metals are used, namely W/B=1/1 by mole in Com. Ex. 8, Ti/B=½ by mole in Co. Ex. 9, W/Si =1/2 by mole in Com. Ex. 10, and Ti/Si =1/2 by mole in Com. Ex. 11.

The results are shown in Table 3.

TABLE 1

| Example No. | 1 | 2 | 3 | 4 | 5 | 6 | 7 | 8 | 9 |
| --- | --- | --- | --- | --- | --- | --- | --- | --- | --- |
| Composition (%) | | | | | | | | | |
| Cu powder | 85.8 | 85.8 | 85.8 | 85.8 | 85.8 | 85.8 | 85 | 83 | 81 |
| Glass | 3 | 3 | 3 | 3 | 3 | 3 | 3 | 3 | 3 |
| WB | 0.2 | — | — | — | — | — | — | — | — |
| MoB | — | 0.2 | — | — | — | — | — | — | — |
| TiB$_2$ | — | — | 0.2 | — | — | — | 0.5 | 1 | 3 |
| TaB$_2$ | — | — | — | 0.2 | — | — | — | — | — |
| NbB$_2$ | — | — | — | — | 0.2 | — | — | — | — |
| CrB | — | — | — | — | — | 0.2 | — | — | — |
| Organic binder | 11 | 11 | 11 | 11 | 11 | 11 | 11 | 11 | 11 |
| Solderability | | | | | | | | | |
| Firing 1 time | 100 | 100 | 100 | 100 | 100 | 100 | 100 | 98 | 95 |
| Firing 3 times | 98 | 95 | 95 | 95 | 95 | 95 | 98 | 95 | 90 |
| Firing 5 times | 98 | 95 | 95 | 95 | 95 | 95 | 95 | 90 | 80 |
| Adhesion | | | | | | | | | |
| Firing 1 time | 3.3 | 3.4 | 3.9 | 3.1 | 3.0 | 3.7 | 3.5 | 2.9 | — |
| Firing 5 times | 3.0 | 2.9 | 3.2 | 2.8 | 2.8 | 3.6 | 3.1 | 2.4 | — |

TABLE 2

| Example No. | 10 | 11 | 12 | 13 | 14 | 15 | 16 | 17 | 18 |
| --- | --- | --- | --- | --- | --- | --- | --- | --- | --- |
| Composition (%) | | | | | | | | | |
| Cu powder | 85.8 | 85.8 | 85.8 | 85.8 | 85.8 | 85.8 | 85 | 83 | 81 |
| Glass | 3 | 3 | 3 | 3 | 3 | 3 | 3 | 3 | 3 |
| WSi$_2$ | 0.2 | — | — | — | — | — | 1 | 3 | 5 |
| MoSi$_2$ | — | 0.2 | — | — | — | — | — | — | — |
| TiSi$_2$ | — | — | 0.2 | — | — | — | — | — | — |
| TaSi$_2$ | — | — | — | 0.2 | — | — | — | — | — |
| NbSi$_2$ | — | — | — | — | 0.2 | — | — | — | — |
| CrSi$_2$ | — | — | — | — | — | 0.2 | — | — | — |
| Organic binder | 11 | 11 | 11 | 11 | 11 | 11 | 11 | 11 | 11 |
| Solderability | | | | | | | | | |
| Firing 1 time | 100 | 100 | 100 | 100 | 100 | 100 | 100 | 98 | 95 |
| Firing 3 times | 98 | 95 | 95 | 95 | 95 | 95 | 98 | 95 | 90 |
| Firing 5 times | 98 | 95 | 95 | 95 | 95 | 95 | 95 | 90 | 80 |
| Adhesion | | | | | | | | | |
| Firing 1 time | 3.3 | 3.4 | 3.9 | 3.1 | 3.0 | 3.7 | 3.1 | 2.5 | 1.2 |
| Firing 5 times | 3.0 | 2.9 | 3.2 | 2.8 | 2.8 | 3.6 | 2.0 | 2.1 | — |

EXAMPLES 7 TO 9

Copper conductors were prepared in the same manner as in Example 1 except that the amount of boride (TiB$_2$) was changed as shown in Table 1.

TABLE 3

| Com. Ex. No. | 1 | 2 | 3 | 4 | 5 | 6 | 7 | 8 | 9 | 10 | 11 |
| --- | --- | --- | --- | --- | --- | --- | --- | --- | --- | --- | --- |
| Composition (%) | | | | | | | | | | | |
| Cu powder | 89 | 86 | 85.8 | 85.8 | 85.8 | 85.8 | 85.8 | 85.8 | 85.8 | 85.8 | 85.8 |

TABLE 3-continued

| Com. Ex. No. | 1 | 2 | 3 | 4 | 5 | 6 | 7 | 8 | 9 | 10 | 11 |
|---|---|---|---|---|---|---|---|---|---|---|---|
| Glass | — | 3 | 3 | 3 | 3 | 3 | 3 | 3 | 3 | 3 | 3 |
| W | — | — | 0.2 | — | — | — | — | 0.19 | — | 0.15 | — |
| Mo | — | — | — | 0.2 | — | — | — | — | — | — | — |
| Ti | — | — | — | — | 0.2 | — | — | — | 0.14 | — | 0.09 |
| B | — | — | — | — | — | 0.2 | — | 0.01 | 0.06 | — | — |
| Si | — | — | — | — | — | — | 0.2 | — | — | 0.05 | 0.01 |
| Organic binder | 11 | 11 | 11 | 11 | 11 | 11 | 11 | 11 | 11 | 11 | 11 |
| Solderability | | | | | | | | | | | |
| Firing 1 time | 100 | 90 | 95 | 90 | 80 | 95 | 70 | 95 | 95 | 85 | 65 |
| Firing 3 times | 100 | 50 | 85 | 80 | 50 | 90 | 50 | 85 | 90 | 70 | 40 |
| Firing 5 times | 98 | 0 | 55 | 35 | 0 | 90 | 0 | 70 | 60 | 40 | 0 |
| Adhesion | | | | | | | | | | | |
| Fixing 1 time | — | 3.2 | 1.3 | 1.5 | 3.5 | 0.5 | 2.0 | 0.7 | 0.9 | 1.6 | — |
| Fixing 5 times | — | — | — | — | — | — | — | — | — | — | — |

From the results shown in Tables 1 and 2, it is understood that the conductors containing borides or silicides have a good solderability as well as a stable adhesion property.

On the other hand, the conductor of Com. Ex. 1 made of only copper without containing an inorganic binder (glass) shows little deterioration of solderability against repeated firing, thus it is observed that the conductor is scarcely affected by oxygen in $N_2$ atmosphere. However, the conductor has no adhesion. The conductor of Com. Ex. 2 consisting only of copper and glass loses the solderability by repeated firing.

From the results of Comparative Examples 3 to 7 wherein a metal is used, it is observed that the conductors incorporated with Ti or Si which acts to lower the melting point shows deterioration of solderability the melting point shows deterioration of solderability even by firing once (Com. Exs. 5 and 7), and that the conductors incorporated with W and Mo are durable against firing of 3 times with respect to the solderability, but further firing shows deterioration of solderability with remarkable lowering of adhesion (Com. Exs. 3 and 4). The addition of B is effective for improving the solderability, but the adhesion is very poor (Com. Ex. 6). Also, it is understood that even if the metals are used in combination with B or Si, conductors having satisfactory solderability and adhesion are not obtained.

In addition to the ingredients used in the Examples, other ingredients can be used in the Examples as set forth in the specification to obtain substantially the same results.

What we claim is:

1. A copper conductor composition comprising 70 to 90% by weight, based on the weight of the composition of copper powder 0.1 to 10% by weight, based on the weight of the composition of an inorganic binder 8 to 20% by weight, based on the weight of the composition of an organic medium, and at least one of (a) 0.01 to 1% by weight, based on the weight of the composition, of a metal boride selected from the group consisting of tungsten boride, molybdenum boride, titanium boride, tantalum boride, niobium boride, chromium boride and solid solutions thereof, and (b) 0.01 to 3% by weight, based on the weight of the composition, of a metal silicide selected from the group consisting of tungsten silicide, molybdenum silicide, titanium silicide, tantalum silicide, niobium silicide, chromium silicide, and solid solutions thereof.

* * * * *

UNITED STATES PATENT AND TRADEMARK OFFICE
CERTIFICATE OF CORRECTION

PATENT NO. : 4,906,404
DATED : March 6, 1990
INVENTOR(S) : SUEHIRO et al

It is certified that error appears in the above-identified patent and that said Letters Patent is hereby corrected as shown below:

Column 10, line 26, "composition" should read --composition,--;

line 27, "powder" should read --powder,--;

line 28, "composition of an inorganic binder" should read --composition, of an inorganic binder,--;

line 29, "composition" should read --composition,--.

Signed and Sealed this

Thirteenth Day of August, 1991

Attest:

HARRY F. MANBECK, JR.

Attesting Officer

Commissioner of Patents and Trademarks